United States Patent [19]
Bresin et al.

[11] Patent Number: 5,420,377
[45] Date of Patent: May 30, 1995

[54] CIRCUIT ASSEMBLY WITH VENTED SOLDER PADS

[75] Inventors: Mark S. Bresin, Coral Springs; Alay M. Mehta, Plantation, both of Fla.

[73] Assignee: Motorola, Inc., Schaumburg, Ill.

[21] Appl. No.: 984,632

[22] Filed: Dec. 2, 1992

[51] Int. Cl.$^6$ .................................................. H05K 1/02
[52] U.S. Cl. ........................ 174/263; 174/254; 174/262; 361/767; 361/808; 439/83
[58] Field of Search .............. 174/261, 263 X, 262 X, 174/254; 361/767, 771, 777, 779, 808, 749; 439/77, 83; 29/840, 843; 228/180.21

[56] References Cited

U.S. PATENT DOCUMENTS

| | | | |
|---|---|---|---|
| 4,187,388 | 2/1980 | Roberts | 174/68.5 |
| 4,336,419 | 6/1982 | Wakayama et al. | 174/68.5 |
| 4,551,788 | 11/1985 | Daniel et al. | 361/403 |
| 4,893,216 | 1/1990 | Hagner | 361/406 |

*Primary Examiner*—Leo P. Picard
*Assistant Examiner*—L. Thomas
*Attorney, Agent, or Firm*—Pedro P. Hernandez

[57] ABSTRACT

A circuit assembly (100) includes a circuit carrier (102) and a solder pad (104). Circuit carrier (102) further includes at least one vent (108) formed in the circuit carrier (102) for venting gases developed during the process of soldering a component or contact (110) to solder pad (104). The one or more vents (108) prevent solder gases to get trapped in the solder joint during the soldering process. Without vent(s) (108) if the contact (110) to be mounted is substantially the size of the solder pad (104) or larger, gases would tend to be trapped and cause the solder joint to weaken.

17 Claims, 2 Drawing Sheets

CIRCUIT ASSEMBLY WITH VENTED SOLDER PADS

TECHNICAL FIELD

This invention relates generally to circuit carriers, and more specifically to a circuit assembly having a vented solder pad.

BACKGROUND

During the process of soldering components such as electronic devices or conductive contacts onto solder pads (e.g., such as by using conventional solder reflow techniques), gases developed during the soldering process sometimes are trapped in the component/solder pad joint. These gases sometimes cause voids to develop in the solder joints causing weak and unreliable solder joints to develop. The weak solder joints may lead to premature failure of the circuit assembly.

The problem of weak joints further increases if the component to be soldered completely covers the solder pad to which it is to be mounted on, since there is less chance of the gases to escape during the time the component is being soldered. A need thus exists for a method and apparatus for minimizing the effect of solder gases on the component/solder pad joint.

DETAILED DESCRIPTION OF THE PREFERRED EMBODIMENT

Figure 1:
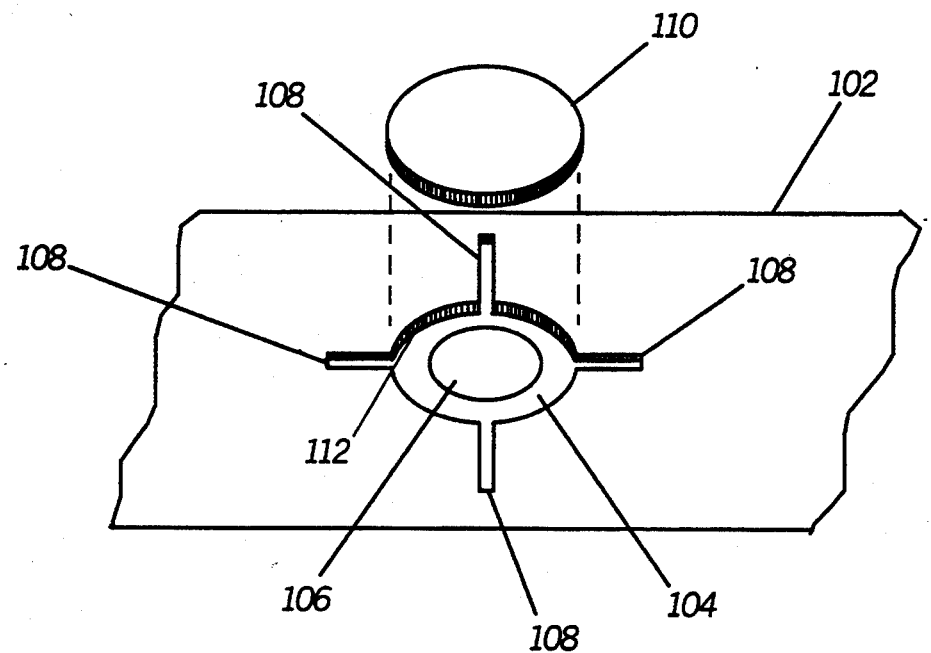
FIG. 1 shows a circuit assembly in accordance with the present invention.

Referring now to the drawings and specifically to FIG. 1, there is shown a circuit assembly 100 in accordance with the present invention. Circuit assembly 100 includes a multi-layer circuit carrier 102 such as a flexible circuit board ("flexible circuit"). Flexible circuit board 102 is formed from one or more layers of non-conductive material such as polyimide or other similar materials known to those skilled in the art. The flexible circuit board 102 has metalized traces made from copper or other similar conductive materials located between the various layers. The metalized traces form conductive runners which interconnect components, conductive contacts, etc. to circuit board 102.

A conductive solder pad 104 is shown with solder paste 106 selectively placed onto pad 104. In circuit assembly 100, the top layer of the flexible circuit is punched or cut-out in order to reveal the conductive solder pad 104. The cut-out also includes as least one vent (channel) 108 extending away from the center of the solder pad (extending away from the exposed circular periphery of the solder pad). Preferably, a plurality of such channels are formed equally spaced around the perimeter of solder pad 104. Vents 108 are preferably formed by removing a portion of one of the non-conductive layers which form flexible circuit board 102. This can be accomplished by selectively cutting out a portion of material from one of the layers of circuit 102. As shown in FIG. 1, material has been cut out on one of the layers of flexible circuit board 102 to expose solder pad 104 and to create vents 108.

Preferably, no copper should be located underneath the punched out vent portions 108. By removing one of the layers of the flexible circuit 102, vents 108 are created which allow for the escape of any gases which are produced during the soldering process.

In a typical soldering process, a component such as a conductive contact 110 having the approximate form as the cut-out area, is placed on top of solder pad 104 and solder paste 106. The diameter of conductive contact 110 is usually the same size or larger than the size of the cut-out on the top layer of the flexible circuit in order to avoid solder from creeping up the side walls of contact 110 during the soldering process. As the assembly is sent through a conventional solder reflow oven, vents 108 allow for any solder gas which develops to be vented away from the solder joint. Both solder pad 104 and vents 108 have a wall thickness 112 which allow for the gases to escape underneath contact 110 and through the vents 108 which extend beyond the footprint of the contact 110.

The length of vents (channels) 108 will be dependent on the size of the component to be soldered to solder pad 104. Preferably, channels 108 should extend further away from the center of solder pad 104 than the footprint of the component to be soldered, in order to allow for gases to properly vent away. The component to be soldered (such as contact 110) should not block the entire length of the channels 108 in order for the solder gases to be able to escape through the channels 108 underneath the component. A plurality of such vents 108 around the periphery of solder pad 104, allows for gases to escape from the solder. Preferably, vents 108 are placed in equal distance from each other in order to balance the escape of solder gases. By placing vents 108 in substantially equal distances from each other around the periphery of solder pad 104 allows for solder paste 106 to melt evenly and also does not cause contact 110 to move in any particular direction during the soldering process but rather helps contact 110 stay centered with regard to solder pad 104.

Although the punched out area 112 which includes vents 108 has been shown as only requiring the punching out of the top layer of the multi-layer circuit assembly 100, more than one layer can be punched out, or all layers can be punched or cut-out as required. The invention will work equally well with flexible circuit assemblies, standard fiberglass circuit boards, or other circuit carriers. In the case the circuit carrier is a single layer of material having a solder pad on its surface, the vents can be channels which are formed in the surface or actual apertures. Since the normal tendency of gases is to rise upward, venting from the bottom of the solder pad by way of a hole is possible but not efficient.

In the case of a single sided flexible circuit, the top coat would be punched out to form the vent and the copper would also be removed. Only the base coat would remain, forming the vent (channel). The solder pad would be pre-coated or pre-clad for protection. It would also be beneficial to have vents 108 substantially equally spaced around the solder pad 104, so as to balance the solder paste melting, and not cause the conductive contact 110 to move in any particular direction but rather to stay centered. Contact 110 is also helped to stay centered if the recess formed by the cut-out is the same area (not including vents 108) as contact 110.

Figure 2:
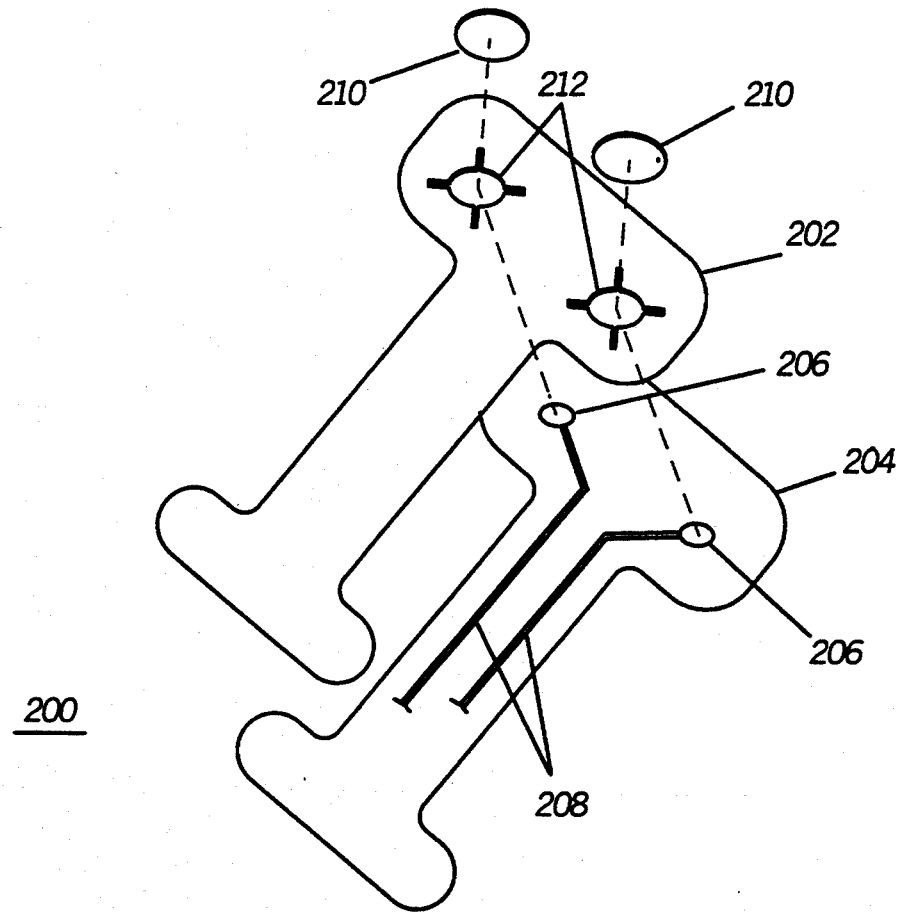
FIG. 2 shows an exploded view of a circuit assembly in accordance with the present invention.

In FIG. 2, an exploded view of a circuit assembly 200 is shown. Circuit assembly 200 is shown as a two-layer flexible circuit assembly including a first layer 202 and a second layer 204. First layer 202 includes punched out locations 212. Second layer 204 includes a pair of conductive solder pads 206 and metal traces 208. Solder pads 206 and traces 208 are formed by etching copper onto layer 204 or by other known manufacturing techniques. The first and second layers are then joined together by using adhesive or other known bonding techniques. Once the two layers are joined, solder paste is applied on top of solder pads 206 and a pair of conductive contacts such as battery contacts 210 are placed in the recess formed by the cut-out areas 212. Finally, the assembly is passed through a soldering process such as a conventional solder reflow oven. The vents in cut-out areas 212 allow for the solder gases to escape even though battery contacts 210 are about the same size as the exposed solder pads 206.

Figure 3:
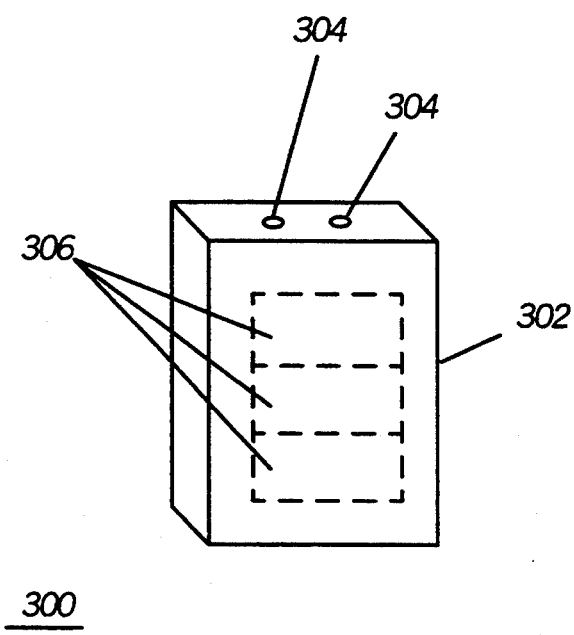
FIG. 3 shows a battery in accordance with the present invention.

In FIG. 3, a battery such as a battery 300 for use with a communication device is shown in accordance with the invention. Battery 300 includes a battery housing 302 and a pair of contacts 304. Contacts 304 are similar to contacts 210 in FIG. 2, are preferably soldered to corresponding solder pads on a circuit carrier such as flexible circuit 200 (shown in FIG. 2). The flexible circuit inside of battery housing 302 electrically couples battery contacts 304 to a plurality of battery cells 306 which form battery 300.

Figure 4:
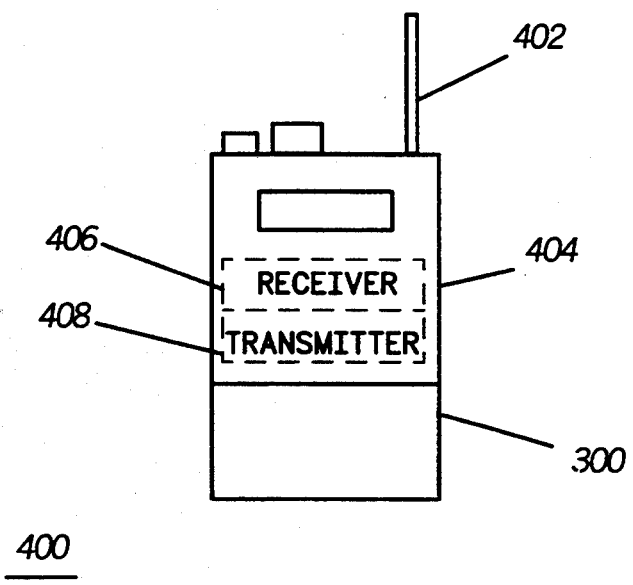
FIG. 4 shows a radio in accordance with the present invention.

In FIG. 4, a communication device such as a two-way radio 400 is shown in accordance with the present invention. Radio 400 includes a transceiver section 404 comprising receiver section 406 and transmitter section 408, battery 300 and antenna 402. Transceiver section 404 includes a circuit assembly (not shown) similar to the circuit assembly 200.

In summary, by providing at least one vent 108 at one or more solder pad locations 104 on a circuit board 100, the gases which are generated during the soldering process can be effectively vented from the solder joint area. This venting of gases allows for the minimization of voids caused in the cooled solder due to gases which were trapped during the soldering process. By minimizing such voids, a stronger and higher quality joint can be achieved. This in turn reduces the costs attributed to defects during the manufacturing process, and results in higher quality circuit assemblies.

What is claimed is:

1. A circuit assembly, comprising:
   a circuit carrier having first and second opposed surfaces:
   a solder pad having a periphery located on the first surface: and
   a plurality of vents extending from the periphery of the solder pad which are equally spaced around the periphery of the solder pad.

2. A circuit assembly as defined in claim 1, wherein the at least one vent is an aperture which extends through the first and second surfaces.

3. A circuit assembly as defined in claim 1, wherein the circuit carrier is a flexible circuit.

4. A circuit assembly having first and second layers which are sandwiched together, comprising:
   a conductive contact:
   a solder pad located on the second layer for receiving the conductive contact; and
   an aperture located on the first layer which exposes the conductive contact, the aperture including at least one portion which forms a vent which extends away from the periphery of the exposed solder pad.

5. A circuit assembly, as defined in claim 4, wherein the circuit assembly comprises a flexible circuit assembly.

6. A circuit assembly as defined in claim 4, wherein the at least one vent extends away from the periphery of the solder pad.

7. A circuit assembly as defined in claim 4, wherein the at least one vent comprises an aperture which extends through the first and second layers.

8. A circuit assembly as defined in claim 4, further comprising:
   a component; and
   the portion of the aperture which forms the at least one vent is not covered by the component when it is soldered to the solder pad.

9. A circuit assembly, as defined in claim 8, wherein the component is a battery contact.

10. A battery pack, comprising:
    at least one battery cell; and
    a circuit assembly coupled to the battery cell, the circuit assembly comprising:
    first and second substrate layers attached to each other;
    a solder pad located on the second substrate layer:
    an aperture located on the first substrate layer which exposes the solder pad;
    a conductive contact soldered to the solder pad; and
    the aperture including at least one portion which forms a vent which extends away from the periphery of the solder pad which allows for gases developed during the soldering of the conductive contact to escape.

11. A battery pack as defined in claim 10, wherein the at least one vent is an aperture which extends through the first and second substrate layers.

12. A battery pack as defined in claim 10, wherein the first and second substrate layers comprise flexible circuits.

13. A battery pack, comprising:
    at least one battery cell; and
    a circuit assembly coupled to the battery cell, the circuit assembly comprising:
    a circuit carrier having first and second opposed surfaces;
    a solder pad having a periphery located on the first surface; and
    a plurality of vents which are equally spaced around the periphery of the solder pad and which extend away from the periphery of the solder pad.

14. A radio receiver having a circuit assembly, comprising:
    the circuit assembly including:
    a circuit carrier having first and second opposed surfaces;
    a solder pad having a periphery located on the first surface; and
    a plurality of vents extending away from the periphery of the solder pad;
    which are equally spaced around the periphery of the solder pad.

15. A radio receiver as defined in claim 14, wherein the at least one vent is an aperture which extends through the first and second surfaces.

16. A radio receiver as defined in claim 14, wherein the circuit carrier is a flexible circuit.

17. A circuit assembly as defined in claim 4, wherein the conductive contact is soldered to the solder pad and the vent allows for gases developed during the soldering of the conductive contact to the solder pad to escape.

* * * * *